(12) United States Patent
Park et al.

(10) Patent No.: US 11,728,198 B2
(45) Date of Patent: Aug. 15, 2023

(54) ELECTROSTATIC CHUCK AND WAFER ETCHING DEVICE INCLUDING THE SAME

(71) Applicant: Samsung Electronics Co., Ltd., Suwon-si (KR)

(72) Inventors: Myoung-Soo Park, Seongnam-si (KR); Siqing Lu, Seongnam-si (KR); Michio Ishikawa, Yokohama (JP); Masashi Kikuchi, Yokohama (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 630 days.

(21) Appl. No.: 16/432,281

(22) Filed: Jun. 5, 2019

(65) Prior Publication Data

US 2020/0066565 A1 Feb. 27, 2020

(30) Foreign Application Priority Data

Aug. 27, 2018 (KR) .................. 10-2018-0100575

(51) Int. Cl.
*H01L 21/283* (2006.01)
*H01L 21/67* (2006.01)
*H01L 21/683* (2006.01)

(52) U.S. Cl.
CPC .... *H01L 21/6833* (2013.01); *H01L 21/67063* (2013.01); *H01L 21/67103* (2013.01)

(58) Field of Classification Search
None
See application file for complete search history.

(56) References Cited

U.S. PATENT DOCUMENTS

| | | | |
|---|---|---|---|
| 8,587,113 B2 | 11/2013 | Gaff et al. |
| 8,852,964 B2 | 10/2014 | Kimura et al. |
| 8,941,969 B2 | 1/2015 | Thach et al. |
| 9,267,739 B2 | 2/2016 | Chen et al. |
| 9,392,643 B2 | 7/2016 | Singh et al. |
| 9,666,466 B2 | 5/2017 | Parkhe et al. |
| 9,681,497 B2 | 6/2017 | Nangoy et al. |
| 9,775,194 B2 | 9/2017 | Pease et al. |
| 9,824,904 B2 | 11/2017 | Benjamin et al. |

(Continued)

FOREIGN PATENT DOCUMENTS

| | | | |
|---|---|---|---|
| JP | 2005277048 A | 10/2005 |
| JP | 2009087703 A | 4/2009 |

(Continued)

OTHER PUBLICATIONS

Office Action dated Feb. 2, 2023 issued by the Korean Intellectual Property Office for corresponding patent application KR Patent Application No. 10-2018-0100575.

*Primary Examiner* — Jeffrie R Lund
*Assistant Examiner* — Tiffany Z Nuckols
(74) *Attorney, Agent, or Firm* — Muir Patent Law, PLLC

(57) ABSTRACT

An electrostatic chuck according to an embodiment includes a fixing plate on which a wafer is fixed, an electrostatic plate located under the fixing plate and configured to generate an electrostatic force to fix the wafer on the fixing plate, a plurality of heating elements located under the electrostatic plate and separated to locally control a temperature of the electrostatic plate, and a cooling plate located under the plurality of separated heating elements and configured to emit heat transferred by the plurality of separated heating elements.

18 Claims, 12 Drawing Sheets

(56) References Cited

U.S. PATENT DOCUMENTS

| | | | |
|---|---|---|---|
| 2005/0098120 A1* | 5/2005 | Maki | H01L 21/6831 118/728 |
| 2008/0037195 A1* | 2/2008 | Himori | H01L 21/6833 361/234 |
| 2010/0039747 A1* | 2/2010 | Sansoni | H01L 21/6833 361/234 |
| 2011/0092072 A1 | 4/2011 | Singh et al. | |
| 2012/0115254 A1 | 5/2012 | Singh | |
| 2013/0068750 A1 | 3/2013 | Gaff et al. | |
| 2013/0072035 A1 | 3/2013 | Gaff et al. | |
| 2013/0126509 A1 | 5/2013 | He et al. | |
| 2013/0220989 A1 | 8/2013 | Pease et al. | |
| 2013/0269368 A1 | 10/2013 | Gaff et al. | |
| 2014/0004702 A1 | 1/2014 | Singh | |
| 2014/0047705 A1 | 2/2014 | Singh et al. | |
| 2014/0154819 A1 | 6/2014 | Gaff et al. | |
| 2014/0177123 A1* | 6/2014 | Thach | H01L 21/6831 361/234 |
| 2014/0209596 A1* | 7/2014 | Lubomirsky | H01L 21/6831 219/465.1 |
| 2015/0107268 A1 | 4/2015 | Han et al. | |
| 2015/0187619 A1 | 7/2015 | Benjamin et al. | |
| 2015/0366004 A1 | 12/2015 | Nangoy et al. | |
| 2016/0169563 A1 | 6/2016 | Han et al. | |
| 2016/0370796 A1 | 12/2016 | Musselman et al. | |
| 2016/0372352 A1 | 12/2016 | Wu et al. | |
| 2018/0358262 A1 | 12/2018 | Lu et al. | |
| 2019/0088517 A1* | 3/2019 | Kosakai | H01L 21/6833 |

FOREIGN PATENT DOCUMENTS

| | | | |
|---|---|---|---|
| JP | 2017084523 A | | 5/2017 |
| KR | 1020120103596 A | | 9/2012 |
| KR | 101458864 B1 | | 11/2014 |
| KR | 1020180028400 A | | 3/2018 |
| KR | 10-2018-0134037 A | | 12/2018 |
| WO | WO-2016080501 A | * 5/2016 | C08G 18/48 |

* cited by examiner

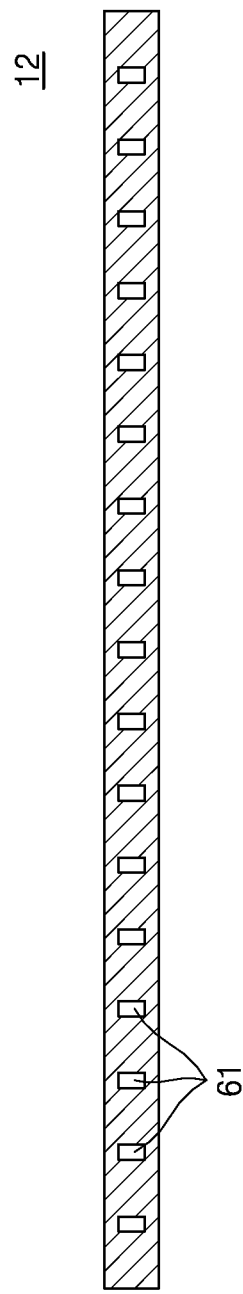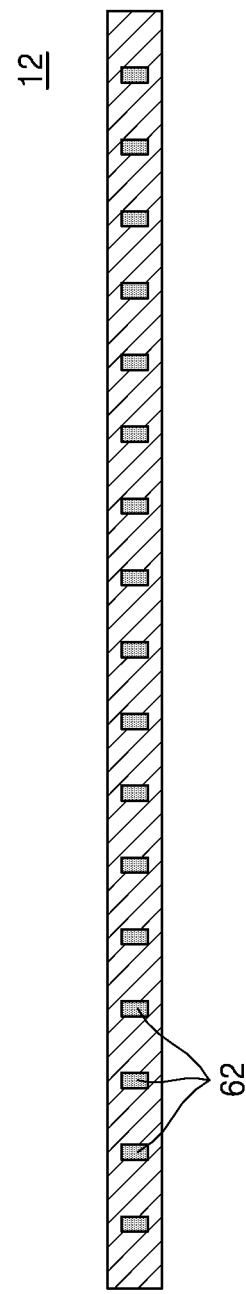

ELECTROSTATIC CHUCK AND WAFER ETCHING DEVICE INCLUDING THE SAME

CROSS-REFERENCE TO RELATED APPLICATION

This application claims the benefit of Korean Patent Application No. 10-2018-0100575, filed on Aug. 27, 2018, in the Korean Intellectual Property Office, the disclosure of which is incorporated herein by reference in its entirety.

FIELD

The inventive concept relates to an electrostatic chuck and a wafer etching device mounted with the electrostatic chuck, and more particularly, to an electrostatic chuck capable of controlling a temperature of a wafer fixed above the electrostatic chuck and a wafer etching device mounted with the electrostatic chuck.

BACKGROUND

As the critical dimension (CD) of semiconductor chips formed on a wafer is reduced, an etching process of a wafer becomes more complicated. In the etching process, a temperature of semiconductor chips on the wafer fixed above the electrostatic chuck may be uneven. Therefore, the performance of the semiconductor chips may be different from each other, and a plurality of defective semiconductor chips may be produced.

SUMMARY

The inventive concept provides an electrostatic chuck configured to make the performance of semiconductor chips formed on a wafer uniform and effectively suppress defects of the semiconductor chips, and the inventive concept further provides a wafer etching device including the electrostatic chuck.

According to an aspect of the inventive concept, there is provided an electrostatic chuck including a fixing plate on which a wafer is fixed, an electrostatic plate located under the fixing plate and configured to generate an electrostatic force to fix the wafer on the fixing plate, a plurality of heating elements located under the electrostatic plate and separated to locally control a temperature of the electrostatic plate, and a cooling plate located under the plurality of separated heating elements and configured to emit heat transferred by the plurality of separated heating elements.

According to an aspect of the inventive concept, there is provided a wafer etching device including a process chamber including an interior space to etch a wafer, a gas supply device connected to the process chamber and configured to supply a process gas to etch the wafer, to the interior space of the process chamber to etch, and an electrostatic chuck located inside the process chamber and configured to fix the wafer to be etched by the process gas, wherein the electrostatic chuck includes a fixing plate on which a wafer is fixed, an electrostatic plate located under the fixing plate and configured to generate an electrostatic force to fix the wafer on the fixing plate, a plurality of heating elements located under the electrostatic plate and separated to locally control a temperature of the electrostatic plate, and a cooling plate located under the plurality of separated heating elements and configured to emit heat transferred by the plurality of separated heating elements, wherein the electrostatic plate includes a heat blocking wall configured to locally distribute, on the electrostatic plate, the heat transferred from the plurality of separated heating elements.

According to an aspect of the inventive concept, there is provided a wafer temperature control device including an electrostatic plate configured to generate electrostatic force to fix a wafer, and a plurality of heating elements located under the electrostatic plate and separated to locally control a temperature of the electrostatic plate, wherein the electrostatic plate further includes a heat blocking wall configured to locally distribute, on the electrostatic plate, the heat transferred from the plurality of separated heating elements, and the plurality of separated heating elements are individually controlled.

BRIEF DESCRIPTION OF THE DRAWINGS

Embodiments of the inventive concept will be more clearly understood from the following detailed description taken in conjunction with the accompanying drawings in which:

FIGS. 6A and 6B are internal cross-sectional views of electrostatic plates according to an embodiment;

DETAILED DESCRIPTION OF THE EMBODIMENTS

Hereafter, embodiments of the inventive concept will now be described in detail with reference to the accompanying drawings.

Figure 1:
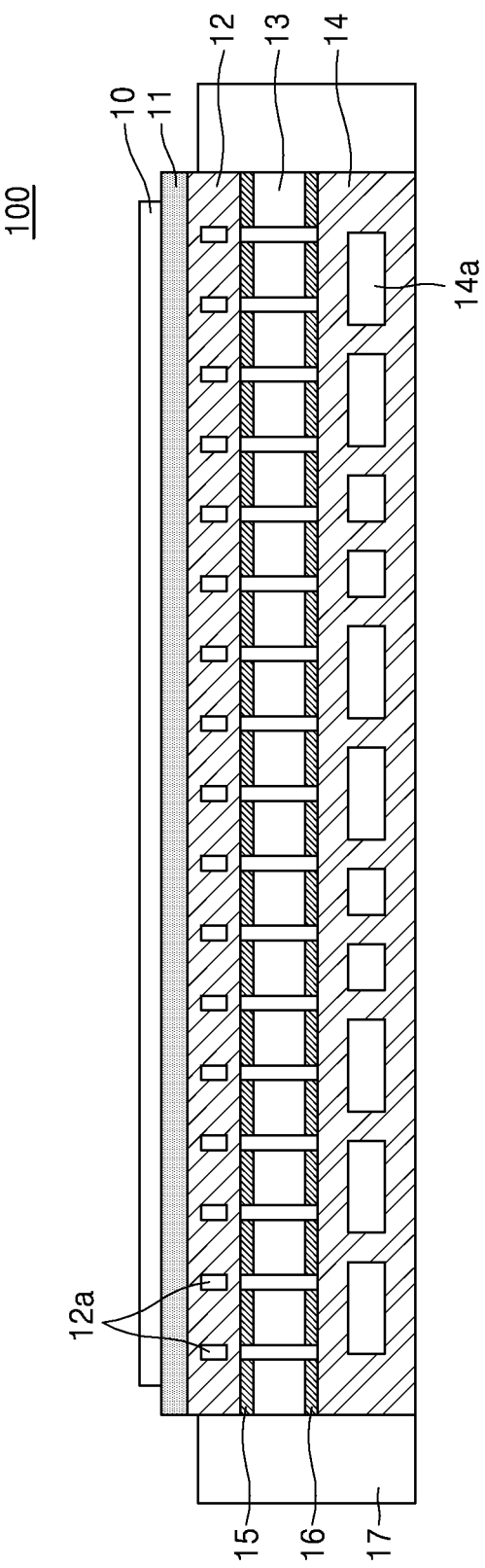
FIG. 1 is a cross-sectional view of an electrostatic chuck according to an embodiment.
Figure 2:
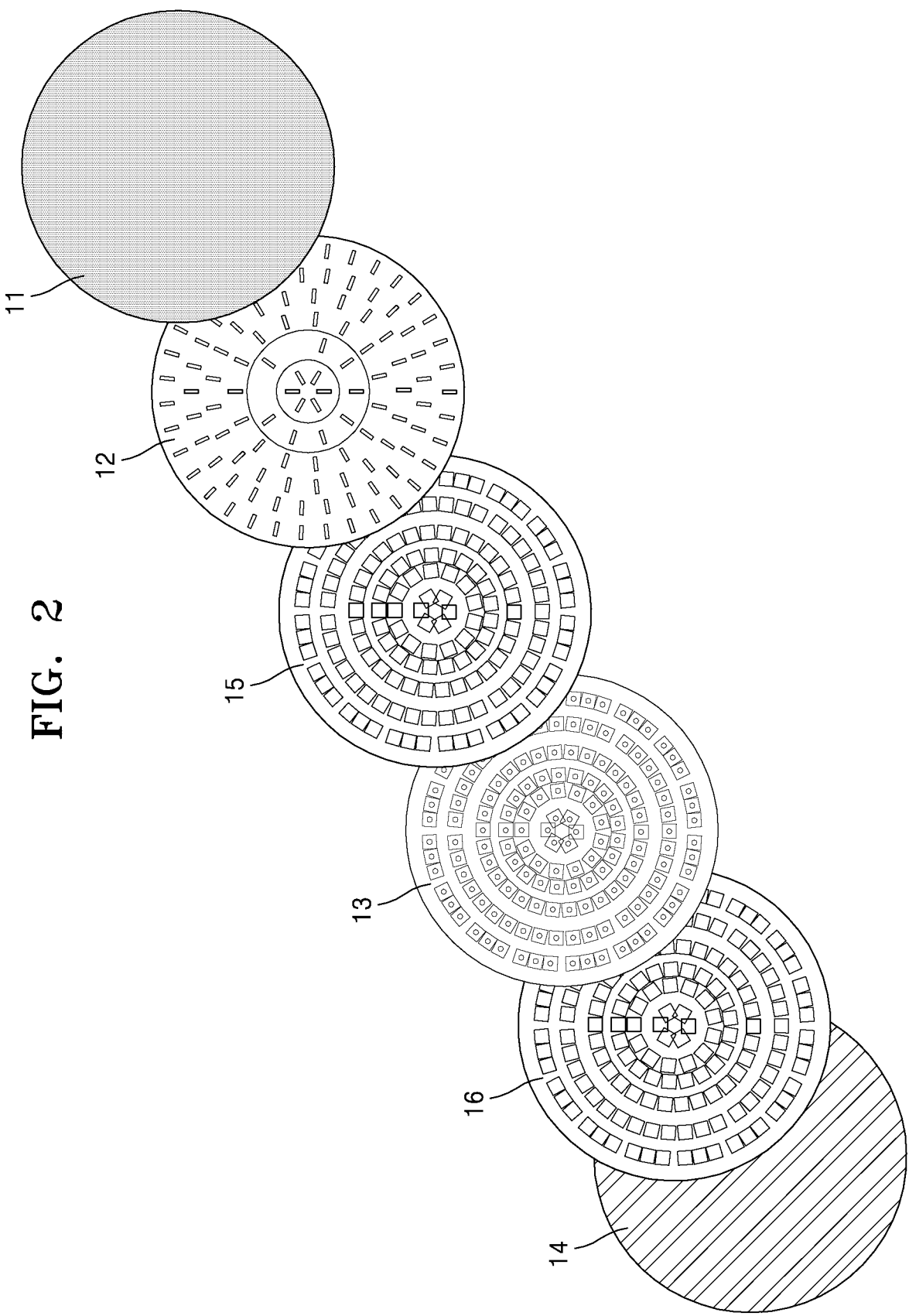
FIG. 2 is a plan view of configurations of an electrostatic chuck according to an embodiment.

FIG. 1 is a cross-sectional view of an electrostatic chuck (ESC) 100 according to an embodiment. FIG. 2 is a plan view of elements of the ESC 100 according to an embodiment.

Referring to FIGS. 1 and 2, the ESC 100 according to an embodiment includes a fixing plate 11, an electrostatic plate 12, a plurality of heating elements 13, and a cooling plate 14.

A wafer 10 may be adhered and fixed to an upper surface of the fixing plate 11 of the ESC 100. The fixing plate 11 may provide a flat surface such that the wafer 10 may strongly adhere to the upper surface of the fixing plate 11. Since the fixing plate 11 needs to have a tolerance to high-temperature plasma generated during a wafer etching process, the fixing plate 11 may include a material that is less transformed by heat. In addition, the fixing plate 11 may include a non-conductive material to protect the wafer 10 from a high voltage applied on the electrostatic plate 12. The wafer 10, as will be described later, may be adhered to the fixing plate 11 by an electrostatic force of the electrostatic plate 12 located under the fixing plate 11. Therefore, the fixing plate 11 may be formed to have a sufficiently small thickness so as not to reduce the electrostatic force of the electrostatic plate 12. The fixing plate 11 may have a circular shape or a disk shape.

The electrostatic plate 12 of the ESC 100 may be located under the fixing plate 11. The electrostatic plate 12 may mechanically support the fixing plate 11. The fixing plate 11 and the electrostatic plate 12 may be strongly connected by a connecting member such as a bolt and a nut.

Figure 10:
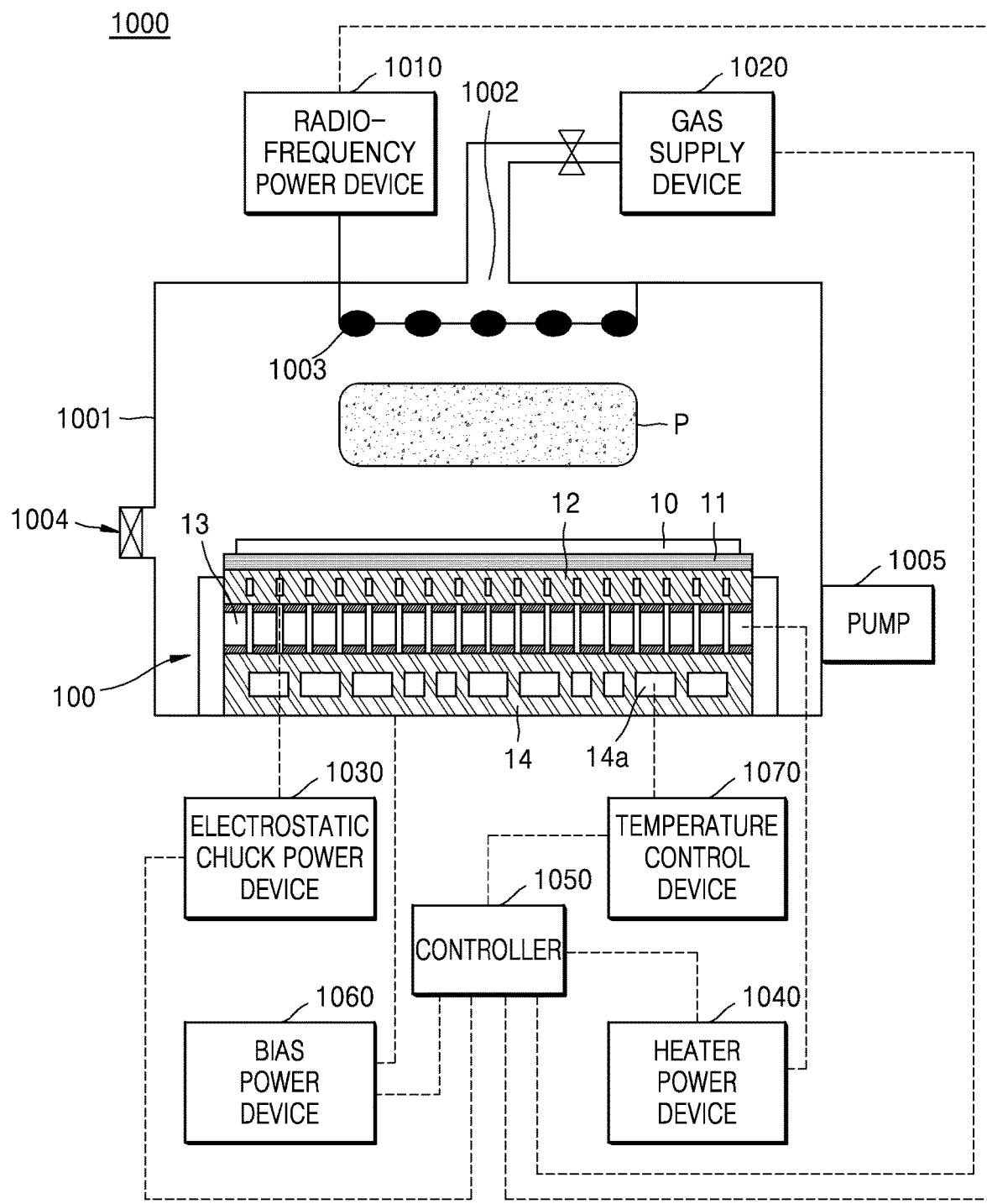
FIG. 10 is a cross-sectional view of the inside of a wafer etching device including an electrostatic chuck according to an embodiment.

The electrostatic plate 12 may be electrically connected to an ESC power device 1030 in FIG. 10. An electrostatic force may be generated between the electrostatic plate 12 and the wafer 10 by power applied from the ESC power device 1030, for example, a direct current voltage. The wafer 10 may strongly adhere to the upper surface of the fixing plate 11 located on the electrostatic plate 12 by the electrostatic force. Therefore, the electrostatic plate 12 may include a material having a good electrical conductivity.

The electrostatic plate 12 may receive heat generated from the plurality of heating elements 13. The plurality of heating elements 13, as will be described later, may be individually controlled to be heated or cooled. The electrostatic plate 12 may locally transfer the heat received from the plurality of heating elements 13 to the fixing plate 11 to heat or cool the fixing plate 11. In addition, the electrostatic plate 12 may receive heat of the fixing plate 11 heated by high-temperature plasma generated in a wafer etching process and transfer the heat to the cooling plate 14 to cool the fixing plate 11. Therefore, the electrostatic plate 12 may include a material having good thermal conductivity and/or small thermal distortion.

To prevent heat generated in the plurality of heating elements 13 from being evenly distributed on a surface of the electrostatic plate 12 due to the high thermal conductivity of the electrostatic plate 12, the electrostatic plate 12 may further include a heat blocking wall 12a. Since the electrostatic plate 12 may include the heat blocking wall 12a, a local temperature control on the surface of the electrostatic plate 12 may be controlled.

The electrostatic plate 12 may have a circular shape or a disk shape, and the heat blocking wall 12a may be formed in a radial shape or an azimuthal shape on the electrostatic plate 12. The electrostatic plate 12 and the heat blocking wall 12a on the electrostatic plate 12 will be described in more detail with reference to FIGS. 5 to 6B.

The ESC 100 may include the plurality of heating elements 13. The plurality of heating elements 13 may be located below the electrostatic plate 12. The plurality of heating elements 13 may be separately formed to control the local temperature control of the electrostatic plate 12. An upper surface of the plurality of heating elements 13 may be formed in various areas. In an embodiment, at least one of the plurality of heating elements 13 may have an upper surface corresponding to an area of an individual semiconductor chip on the wafer 10. The upper surface of the plurality of heating elements 13 may be formed as the area of the individual semiconductor chip such that individual temperatures of a plurality of semiconductor chips on the wafer 10 mounted on the fixing plate 11 may be controlled. However, the area of the upper surface of the plurality of heating elements 13 is not limited thereto, and may be formed in various areas. In an embodiment, the plurality of heating elements 13 may have an upper surface corresponding to 2 times to 10 times the area of the individual semiconductor chip on the wafer 10.

The plurality of heating elements 13 may emit heat to locally heat the electrostatic plate 12 and absorb the heat to locally cool the electrostatic plate 12. In addition, the plurality of heating elements 13 may receive heat of the fixing plate 11 heated by high-temperature plasma in a wafer etching process and transfer the heat to the cooling plate 14. Therefore, the plurality of heating elements 13 may include a material having good thermal conductivity.

In an embodiment, the plurality of heating elements 13 may include a thermoelectric element, a resistance heater, and an inductance heater. However, the plurality of heating elements 13 are not limited thereto and may include other heating or heat absorbing devices.

The plurality of heating elements 13 may be individually controlled to locally distribute heat in the electrostatic plate 12. The plurality of heating elements 13 may be individually controlled by various methods such as a time-sharing multiplexing control, matrix multiplexing control, or the like. In addition, a method of controlling the heating elements 13, which are adjacent to each other, in one cluster may be used to simplify controlling the plurality of heating elements 13.

The plurality of heating elements 13 may include a metal such as tungsten (W), copper (Cu), nickel (Ni), molybdenum (Mo), titanium (Ti), nickel-chromium alloy (Ni—Al alloy), or may also include a conductive ceramic such as tungsten carbide (WC), molybdenum carbide (MoC), titanium nitride (TiN), or the like.

The plurality of heating elements 13 may be electrically connected to a heater power device 1040 in FIG. 10 and a controller 1050 in FIG. 10. The plurality of heating elements 13 may generate heat or absorb heat by power of the heater power device 1040, for example, an alternating current voltage. The plurality of heating elements 13 may have a concentrical or helical pattern with respect to a central axis.

The ESC 100 may include the cooling plate 14. The cooling plate 14 may be located below the plurality of heating elements 13. The cooling plate 14 may release heat received by the plurality of heating elements 13 to the outside. Due to a cooling action of the cooling plate 14, the wafer 10 on the fixing plate 11 may not be damaged in a wafer etching process that generates high-temperature plasma. In addition, due to the cooling action of the cooling plate 14, a plurality of mechanical devices located under the ESC 100 may be protected from high temperatures.

The cooling plate 14 may be provided with a cooling channel 14a through which cooling water flows. For example, the cooling water may include water, ethylene glycol, silicone oil, liquid Teflon, or a mixture of water and glycol. The cooling channel 14a may have a concentrical or helical pipe structure with respect to a central axis of the cooling plate 14. The cooling channel 14a may be electrically connected to a temperature control device 1070 in FIG. 10 and the controller 1050 in FIG. 10. A flow rate and temperature of the cooling water flowing through the cooling channel 14a may be adjusted by the temperature control device 1070 and the controller 1050.

The ESC 100 may include an upper interfacial material layer 15 and a lower interfacial material layer 16. In particular, the ESC 100 may include the upper interfacial material layer 15 and the lower interfacial material layer 16, the upper interfacial material layer 15 being located between the electrostatic plate 12 and the plurality of heating elements 13, and the lower interfacial material layer 16 being located between the plurality of heating elements 13 and the cooling plate 14.

The upper interfacial material layer 15 may be located above the plurality of heating elements 13 to stably support the electrostatic plate 12. The upper interfacial material layer 15 may act as an electrical insulator between the plurality of heating elements 13 and the electrostatic plate 12 to protect the plurality of heating elements 13 from a high voltage applied to the electrostatic plate 12.

The upper interfacial material layer 15 may transfer heat generated by the plurality of heating elements 13 to the electrostatic plate 12. In addition, the upper interfacial material layer 15 may transfer heat of the electrostatic plate 12, which is heated, to the plurality of heating elements 13. Therefore, the upper interfacial material layer 15 may include various materials having a high coefficient of transmission. An upper interfacial material may be substantially the same as a shape of the plurality of heating elements 13, and thus, the upper interfacial material layer 15 may be formed in a concentrical or helical pattern with respect to a central axis.

The lower interfacial material layer 16 may be located below the plurality of heating elements 13 to stably fix the plurality of heating elements 13 above the cooling plate 14. In addition, the lower interfacial material layer 16 may transfer heat of the heating elements 13, which have received heat from the electrostatic plate 12, which is heated, to the cooling plate 14. Therefore, the lower interfacial material layer 16 may include various materials having a high coefficient of transmission.

Heat generated in the plurality of heating elements 13 may flow in an up direction in which the electrostatic plate 12 is located, or may also flow in a down direction in which the cooling plate 14 is located. The heat generated in the plurality of heating elements 13 controls a temperature of a surface of the electrostatic plate 12, and thus, more flow in the up direction in which the electrostatic plate 12 is located is required. Therefore, a thermal resistance of the upper interfacial material layer 15 may be less than a thermal resistance of the lower interfacial material layer 16. In an embodiment, a coefficient of heat transfer of a material of the upper interfacial material layer 15 may be greater than a coefficient of heat transfer of a material of the lower interfacial material layer 16. In addition, when the coefficient of heat transfer of the upper interfacial material layer 15 is the same as that of the lower interfacial material layer 16, a height formed by the lower interfacial material layer 16 may be greater than a height formed by the upper interfacial material layer 15.

The elements of the ESC 100 may be firmly fixed by a connector 17. Although not shown in FIG. 1 in an embodiment, a connecting groove may be formed in the connector 17 and a protruding unit may be formed on sides of the elements of the ESC 100. The protruding unit of the elements of the ESC 100 may be fitted into the connecting groove of the connector 17, and thus, the elements of the ESC 100 may be firmly fixed to the connector 17. In addition, the elements of the ESC 100 may be fixed to the connector 17 through a connecting member such as a bolt and a nut.

A portion of the fixing plate 11 and the electrostatic plate 12 of the ESC 100 may be exposed to the outside, and the plurality of heating elements 13 and the cooling plate 14 may be covered by the connector 17 and not be exposed to the outside.

A plasma concentration inside a wafer etching device may be uneven, and thus, a temperature of a wafer fixed on an ESC of the related art during an etching process may not be uniform. The non-uniform temperature of the wafer may make a critical dimension of semiconductor chips uneven, and thus, the performances of the semiconductor chips may be different and a number of defective semiconductor chips may be produced.

Therefore, the ESC 100 of the inventive concept may include the plurality of heating elements 13, temperatures of which may be individually controlled. In addition, the heat generated in the plurality of heating elements 13 may be locally distributed on the electrostatic plate 12 due to a shape of the electrostatic plate 12 on which the heat blocking wall 12*a* is formed. Therefore, the wafer etching device including the ESC 100 of the inventive concept may locally control a temperature of a wafer fixed on the ESC 100 in spite of the non-uniform plasma concentration therein, and accordingly, the performances of the semiconductor chips may be uniform and the production of defective semiconductor chips may be suppressed.

Figure 3:
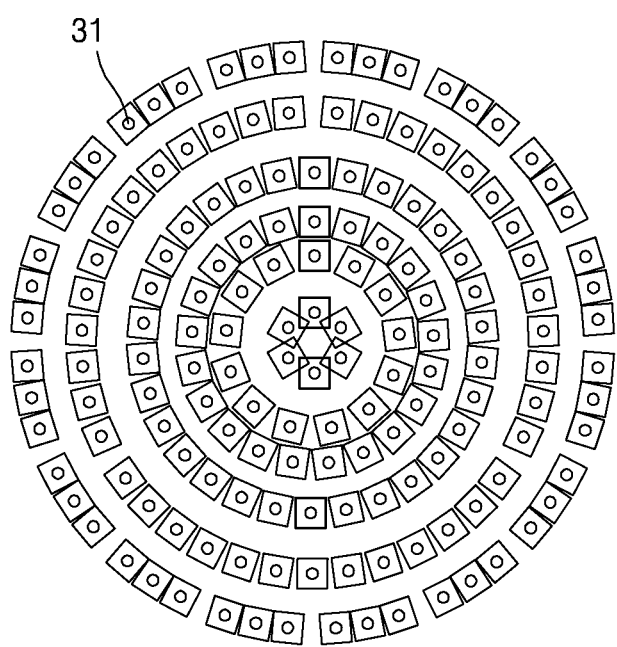
FIG. 3 is a plan view of a plurality of heating elements according to an embodiment.
Figure 4A:
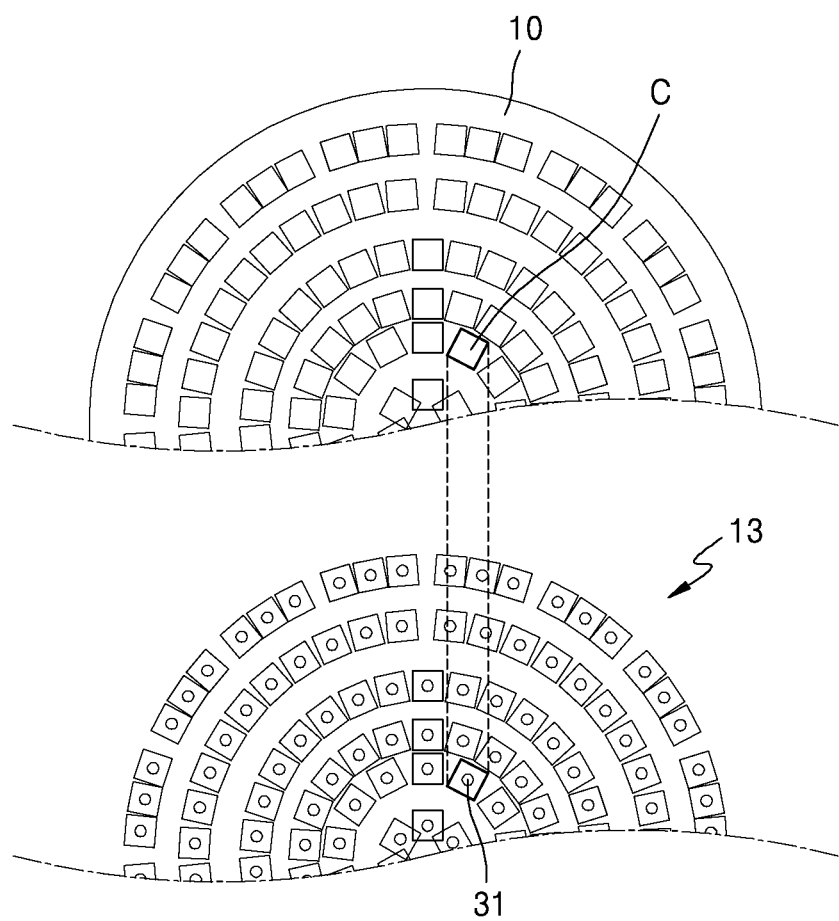
FIGS. 4A and 4B are plan views of a plurality of heating elements arranged under a wafer according to an embodiment.
Figure 4B:
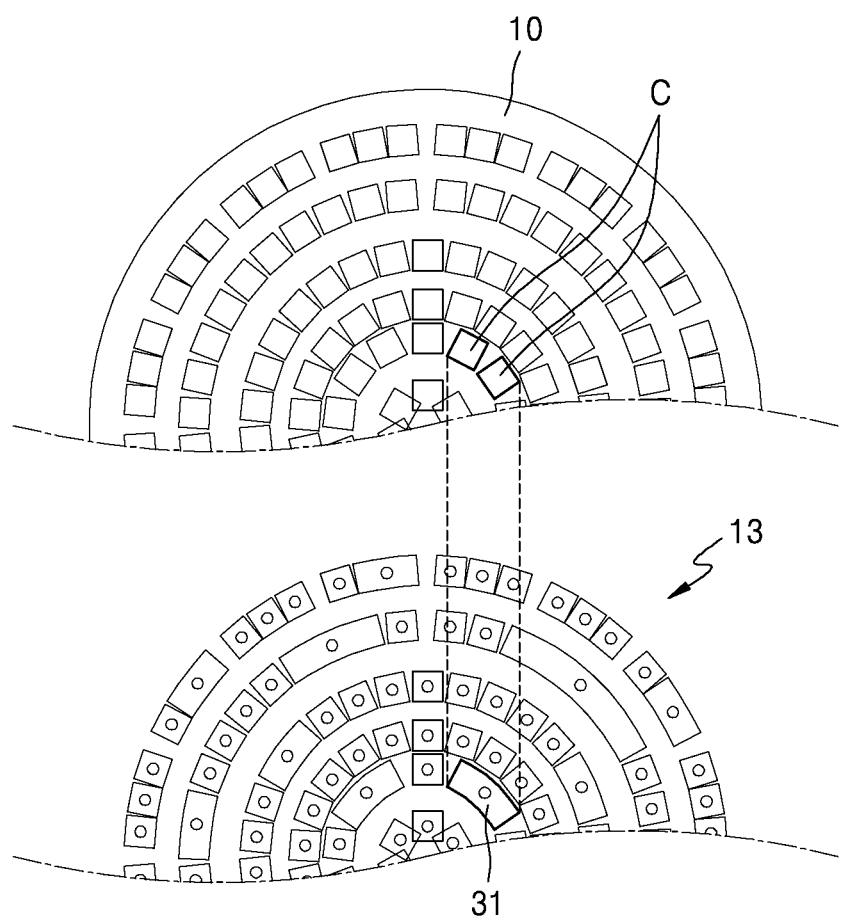

FIG. 3 is a plan view of the plurality of heating elements 13 according to an embodiment. FIGS. 4A and 4B are plan views of the plurality of heating elements 13 arranged under a wafer according to an embodiment.

Referring to FIG. 3, individual heating elements 31 may be apart from one another. The individual heating elements 31 may be arranged in a concentrical pattern with respect to a central axis. However, an arrangement of the individual heating elements 31 is not limited to the concentrical pattern, and the individual heating elements 31 may be arranged in a helical pattern. An empty space may be formed between the individual heating elements 31. The empty space between the individual heating elements 31 is filled with a material having low thermal conductivity, such that the individual heating elements 31 may be firmly fixed to each other. In an embodiment, the material filled between the individual heating elements 31 may include ceramic with low thermal conductivity.

Referring to FIG. 4A, the individual heating elements 31 may have an upper surface corresponding to an area of one semiconductor chip C formed on the wafer 10. In addition, referring to FIG. 4B, the individual heating elements 31 may have an upper surface corresponding to 2 or more semiconductor chips C. For example, some of the plurality of heating elements 13 may be formed as an upper surface with a size of an area corresponding to an area of 2 to 10 semiconductor chips C, and the rest of the plurality of heating elements 13 may have an upper surface with a size corresponding to an area of one semiconductor chip C.

Referring to FIG. 4A, the individual heating elements 31 may be arranged in an array below the individual semiconductor chip C formed on the wafer 10. Referring to FIG. 4B, the individual heating elements 31 formed as the upper surface with a size of an area corresponding to an area of a plurality of semiconductor chips may be arranged in an array in a lower portion of the plurality of semiconductor chips C formed on the wafer 10.

The individual heating elements 31 may be arranged in an array below the semiconductor chip C formed on the wafer 10, and thus, may be individually controlled. Therefore, individual temperatures of the plurality of semiconductor chips C formed on the wafer 10 may be controlled in an etching process of the wafer 10. Therefore, the performances of the semiconductor chips C produced after the etching process may be uniform and a production of defective semiconductor chips may be suppressed.

The plurality of heating elements 13 may include a thermoelectric element. The thermoelectric element may perform heat absorption and heat emission by using a Peltier effect. In particular, the thermoelectric element may include two kinds of metals. When ends of the two kinds of metals are connected and a current flows, one metal may perform heat absorption according to a current direction, and a remaining metal may perform heat emission. The thermoelectric element may switch between the heat absorption and the heat emission according to the current direction, and an amount of the heat absorption and an amount of the heat emission may be controlled according to an amount of the current.

The plurality of heating elements 13 may be a resistance heater. The resistance heater may include a direct resistance heater that directly heats an object to be heated by flow of a current to the object. In addition, the resistance heater may include an indirect resistance heater that indirectly heats the object to be heated by radiating and conducting heat generated when a current is passed through a heating element.

The plurality of heating elements 13 may also be an inductance heater. The inductance heater may adjust an inductance value by using a change of magnetic flux according to a change of an amount of current. The inductance heater may control a caloric value of the inductance heater while controlling the amount of current to adjust the inductance value.

Each of the plurality of heating elements 13 may be electrically connected to the heater power device 1040 and the controller 1050 to be individually controlled.

In addition, the plurality of heating elements 13 may be controlled by a method of time-sharing multiplexing control. Some of the plurality of heating elements 13 may share a control signal path electrically connected to the controller 1050. The controller 1050 may divide the time of a plurality control signals passing through the shared control signal path and independently transfer the divided control signals to the plurality of heating elements 13. A configuration of the controller 1050 may be simplified while independently controlling the plurality of heating elements 13 through the method of time-sharing multiplexing control.

In addition, the plurality of heating elements 13 may be controlled by a method of matrix multiplexing control. The method of matrix multiplexing control may consider the plurality of heating elements 13 as a component of a matrix. The plurality of heating elements 13 in a same row of the matrix may share a row control signal path and the plurality of heating elements 13 in a same column of the matrix may share a column control signal path. The controller 1050 may transfer a plurality of control signals to the plurality of heating elements 13 through the row control signal path and the column control signal path. Therefore, the plurality of heating elements 13 may be independently controlled, and the configuration of the controller 1050 configured to control the plurality of heating elements 13 may be simplified.

The plurality of heating elements 13 are not limited to the above-described methods of time-sharing multiplexing control and matrix multiplexing control and may be controlled individually in various methods.

Figure 5:
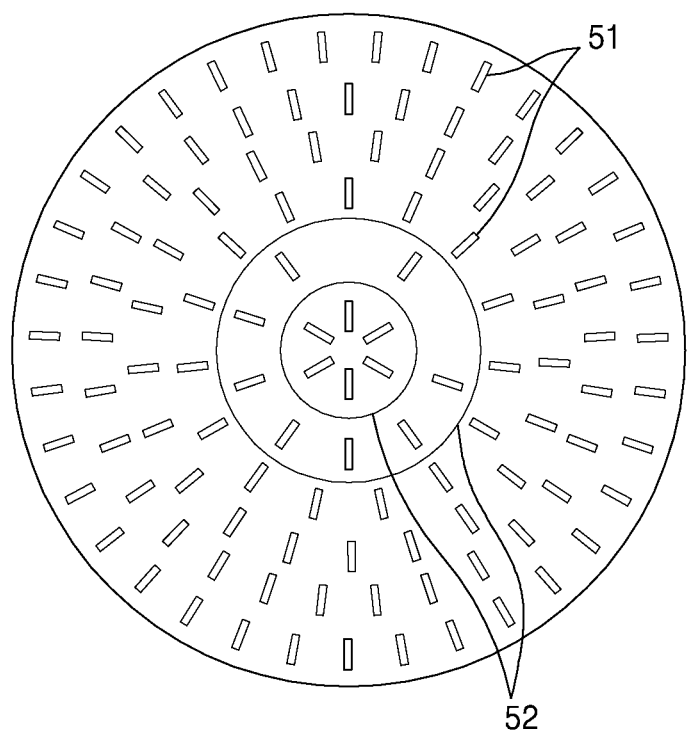
FIG. 5 is a plan view of an electrostatic plate according to an embodiment.

FIG. 5 is a plan view of the electrostatic plate 12 according to an embodiment.

Referring to FIG. 5, the electrostatic plate 12 may be formed as a circular plate. The electrostatic plate 12 may include a supporting function, an electrostatic function, and a heat distribution function.

In particular, the electrostatic plate 12 may mechanically and firmly support the fixing plate 11 on the upper surface of the electrostatic plate 12. The fixing plate 11 and the electrostatic plate 12 may be firmly connected by a connecting member.

In addition, the electrostatic plate 12 may be electrically connected to the ESC power device 1030 and a switch may be provided between the electrostatic plate 12 and the ESC power device 1030. When the switch is turned on, a direct current may be applied from the ESC power device 1030 to the electrostatic plate 12. Therefore, an electrostatic force may be generated between the electrostatic plate 12 and the wafer 10. The wafer 10 may strongly adhere to the fixing plate 11 located on the electrostatic plate 12 by the electrostatic force. Therefore, the electrostatic plate 12 may include a material having a good electrical conductivity.

The electrostatic plate 12 may receive heat generated in the plurality of heating elements 13 described above and transfer the heat to the fixing plate 11 on the electrostatic plate 12 to heat the fixing plate 11. In addition, the electrostatic plate 12 may transfer the heat of the fixing plate 11 heated by high-temperature plasma to the plurality of heating elements 13 to cool the fixing plate 11. Therefore, a material of the electrostatic plate 12 may include a material having good thermal conductivity and small thermal distortion.

The heat generated from the plurality of heating elements 13, which are individually controllable, may be rapidly diffused on the electrostatic plate 12 having good thermal conductivity, such that a temperature of the upper surface of the electrostatic plate 12 may be uniform. In an etching process, when a temperature of an upper surface of an electrostatic plate is uniform, a local temperature control of semiconductor chips on the wafer 10 may become difficult.

Therefore, the electrostatic plate 12 of the inventive concept may further include heat blocking walls 51 and 52. In particular, the electrostatic plate 12 may include the radial heat blocking wall 51 and the azimuthal heat blocking wall 52. The radial heat blocking wall 51 may be formed as spreading out in all directions from a center of the electrostatic plate 12, which is circular. In addition, the radial heat blocking wall 51 may be formed in a concentrical shape surrounding the center of the electrostatic plate 12, which is circular.

The radial heat blocking wall 51 may suppress a diffusion of heat transferred from the plurality of heating elements 13 to the electrostatic plate 12 in an azimuthal direction, and the azimuthal heat blocking wall 52 may suppress a diffusion of heat transferred from the plurality of heating elements 13 to the electrostatic plate 12 in a radial direction.

In particular, the heat transferred to the electrostatic plate 12 may be trapped in a space formed by the radial heat blocking wall 51 and the azimuthal heat blocking wall 52, and a diffusion of heat into the space formed by another radial heat blocking wall 51 and the azimuthal heat blocking wall 52, which are adjacent to each other, may be suppressed. Accordingly, the heat generated in the plurality of heating elements 13 may be transferred on the electrostatic plate 12 and locally distributed. Therefore, in a wafer etching process using the ESC 100 including the electrostatic plate 12, a temperature of a wafer may be locally controlled in spite of a non-uniform plasma concentration within a process chamber. Thus, a performance of semiconductor chips on the wafer may be uniform and production of defective semiconductor chips may be suppressed. The electrostatic plate 12 including the heat blocking walls 51 and 52 will be described later in detail with reference to FIGS. 6A and 6B.

As described above, the electrostatic plate 12 may include a material having high thermal conductivity, high electrical conductivity, and low thermal distortion. In an embodiment, the material of the electrostatic plate 12 of the inventive concept may be a metal matrix composite (MMC). The MMC may be a composite material including at least two or more different kinds of materials. One of the materials of the MMC may be a metal, and other materials may be ceramic or an organic compound. The ceramic or the organic compound may be used as a stiffener in the MMC and filled inside the MMC. The stiffener to be filled in the MMC may change physical properties such as a wear property, a coefficient of friction, a heat conduction quality, and strength of a metal matrix. In an embodiment, the MMC, which is the material of the electrostatic plate 12 of the inventive concept, may be a structure in which a carbon fiber is embedded in an aluminum matrix. In addition, the carbon fiber may be coated with nickel or titanium to prevent a chemical reaction with the aluminum matrix.

Due to characteristics of the MMC, the electrostatic plate 12 may have good thermal conductivity and good electrical conductivity. In addition, the electrostatic plate 12 may be less distorted and have a large strength due to characteristics of the stiffener of the MMC.

FIGS. 6A and 6B are internal cross-sectional views of the electrostatic plate 12 according to an embodiment.

Referring to FIG. 6A, a first heat blocking wall 61 of the electrostatic plate 12, which is an embodiment of the inventive concept, may be formed as a cavity inside the electrostatic plate 12. In addition, the first heat blocking wall 61 of the electrostatic plate 12 may be formed as a trench in a lower portion of the electrostatic plate 12, which is different from FIG. 6A.

The first heat blocking wall 61 formed as a cavity inside the electrostatic plate 12 may act as a heat transfer resistance to prevent heat generated and transferred from the plurality of heating elements 13 from fast diffusion in the electrostatic plate 12.

Referring to FIG. 6B, a second heat blocking wall 62 of the electrostatic plate 12, which is an embodiment of the inventive concept, may include a separate material embedded in the electrostatic plate 12. In addition, different from FIG. 6B, the second heat blocking wall 62 of the electrostatic plate 12 may be combined to a groove formed in a lower portion of the electrostatic plate 12 and a portion of the second heat blocking wall 62 may be exposed to the outside from the lower portion of the electrostatic plate 12.

The second heat blocking wall 62 of the electrostatic plate 12 may act as a heat transfer resistance to prevent heat generated and transferred from the plurality of heating elements 13 from fast diffusion in the electrostatic plate 12. Therefore, a material of the second heat blocking wall 62 may include a material having a lower thermal conductivity than a material of the electrostatic plate 12. In an embodiment, the second heat blocking wall 62 may include a ceramic material having a low thermal conductivity and low thermal distortion.

Effects of the electrostatic plate 12 including the first heat blocking wall 61 and the second heat blocking wall 62 will now be described in detail with reference to FIGS. 7A to 8B.

Figure 7A:
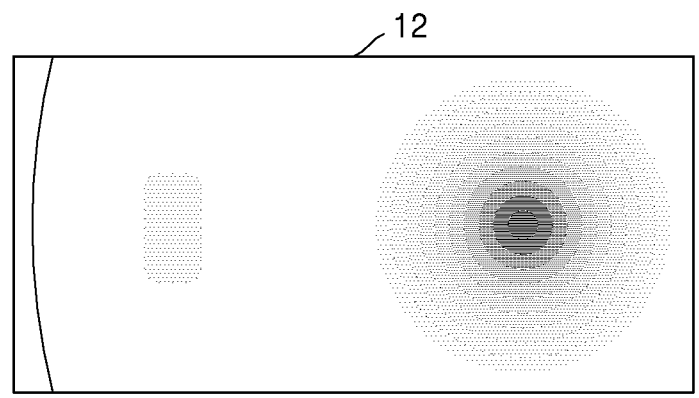
FIG. 7A is a diagram showing a temperature distribution of an electrostatic plate of the related art in which a heat blocking wall is not formed.
Figure 7B:
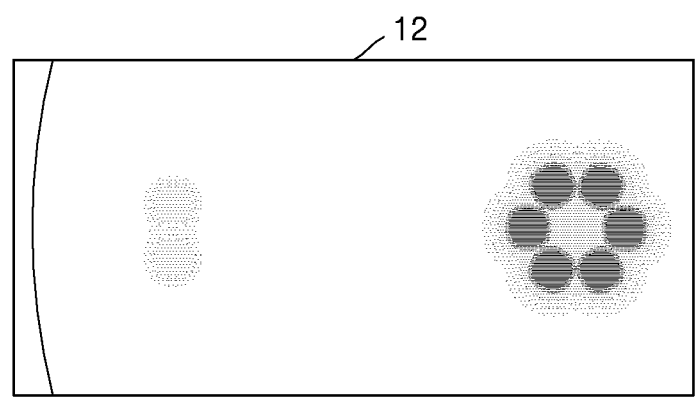
FIG. 7B is a diagram showing a temperature distribution of an electrostatic plate in which a heat blocking wall is formed according to an embodiment.

FIG. 7A is a diagram showing a temperature distribution of an electrostatic plate in which a heat blocking wall is not formed. FIG. 7B is a diagram showing a temperature distribution of an electrostatic plate formed with a heat blocking wall.

Referring to FIG. 7A, heat transferred from the plurality of heating elements 13 may be quickly diffused, by a high thermal conductivity of the electrostatic plate 12, on a surface of the electrostatic plate 12 in which the heat blocking wall is not formed. Therefore, a local temperature control of a plurality of semiconductor chips on the wafer 10 located on the electrostatic plate 12 may be difficult.

Referring to FIG. 7B, heat transferred from the plurality of heating elements 13 may be locally distributed by the heat blocking wall 12a formed in the electrostatic plate on the surface of the electrostatic plate 12 of the inventive concept formed with the heat blocking wall 12a, despite the high thermal conductivity of the electrostatic plate 12. Therefore, an individual temperature control of semiconductor chips on a wafer located on the electrostatic plate 12 may be possible.

Figure 8A:
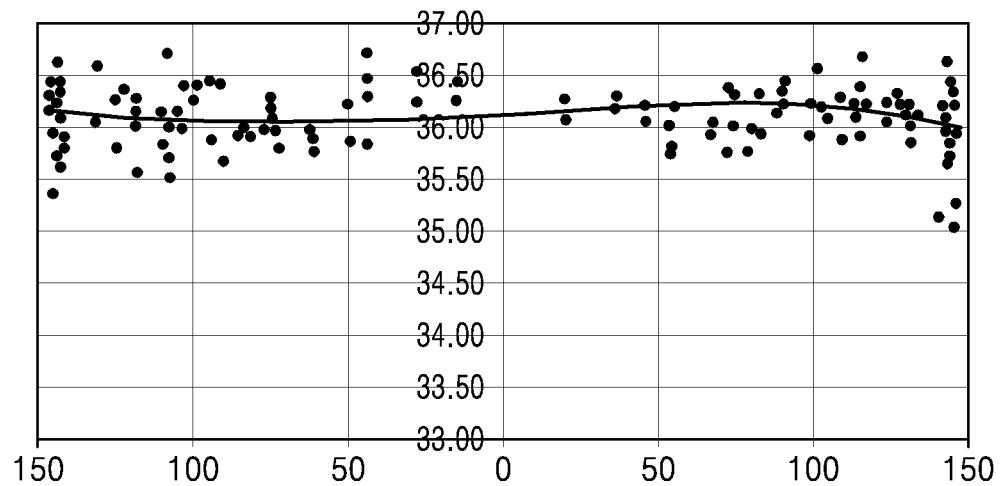
FIG. 8A is a graph showing a critical dimension of semiconductor chips etched by using an electrostatic chuck of the related art.
Figure 8B:
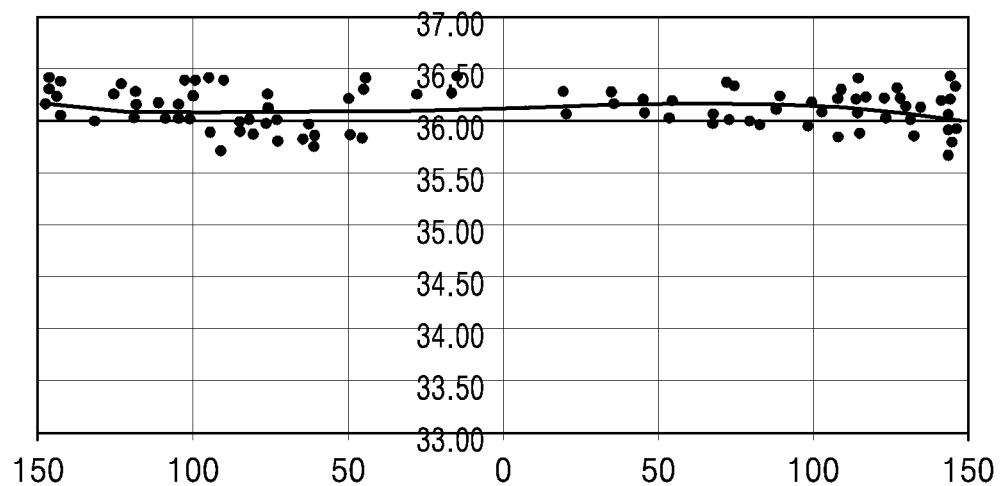
FIG. 8B is a graph showing a critical dimension of semiconductor chips etched by using another electrostatic chuck according to an embodiment.

FIG. 8A is a graph showing a critical dimension of semiconductor chips etched by using an ESC of the related art. FIG. 8B is a graph showing a critical dimension of semiconductor chips etched by using another ESC according to the inventive concept.

In the graphs of FIGS. 8A and 8B, the horizontal axis represents a distance of semiconductor chips from a center of a wafer in millimeters (mm), and the vertical axis represents a critical dimension (CD) of the semiconductor chips that have undergone an etching process in nanometers (nm). Dots on the graphs of FIGS. 8A and 8B show semiconductor chips that have been subjected to an etching process, the etching process having the CD of the vertical axis at the distance from the center of the wafer of the horizontal axis.

Referring to FIG. 8A, a CD of semiconductor chips etched by using an ESC of the related art is not uniform depending on a distance from a center of a wafer. In addition, the CD of the semiconductor chips etched by using the ESC of the related art is not uniform even when the distance from the center of the wafer is the same. A performance of semiconductor chips etched by using the ESC of the related art may be non-uniform and a number of defective semiconductor chips may be produced by using the ESC of the related art.

Referring to FIG. 8B, a CD of semiconductor chips etched by using the ESC 100 of the inventive concept may be uniform depending on a distance from the center of the wafer. In addition, the CD of the semiconductor chips may be uniform even when the distance from the center of the wafer is the same. A contributory factor is that the ESC 100 of the inventive concept includes the plurality of heating elements 13 separated to have a local temperature control of the electrostatic plate 12 and also the electrostatic plate 12 includes the heat blocking wall 12a configured to locally distribute, on the upper surface of the electrostatic plate 12, a heat received from the plurality of heating elements 13. A performance of the semiconductor chips etched by using the ESC 100 of the inventive concept may be uniform and also production of defective semiconductor chips may be suppressed when the ESC 100 of the inventive concept is used.

Figure 9:
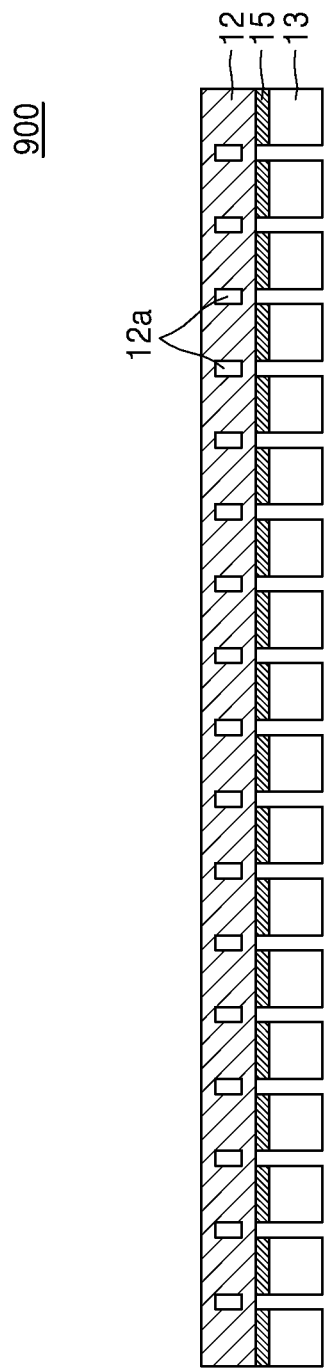
FIG. 9 is a cross-sectional view of a wafer temperature control device according to an embodiment.

FIG. 9 is a cross-sectional view of a wafer temperature control device 900 according to an embodiment.

The wafer temperature control device 900 may include the electrostatic plate 12 configured to generate an electrostatic force to fix a wafer, and a plurality of heating elements 13, which are separated and located under the electrostatic plate 12.

The electrostatic plate 12 of the wafer temperature control device 900 may include the heat blocking wall 12a configured to locally distribute heat transferred from the plurality of heating elements 13, which are separated, on the electrostatic plate 12. Technical features of the electrostatic plate 12 may be substantially the same as those described with reference to FIGS. 1 to 6B, so detailed description thereof will be omitted.

The plurality of heating elements 13, which are separated, of the wafer temperature control device 900, as described above, may be individually controlled and caloric values thereof may be different from each other. In addition, an upper surface of at least one of the plurality of heating elements 13, which are separated, may have an area corresponding to an area of an individual semiconductor chip on the wafer and may also have an area of 2 to 10 semiconductor chips. Technical features of the plurality of heating elements 13, which are separated, may be substantially the same as those described with reference to FIGS. 1 to 4B, so detailed description thereof will be omitted.

The wafer temperature control device 900 may locally distribute heat generated from the plurality of heating elements 13, which are separated, on the electrostatic plate 12 such that a temperature of a wafer located on the electrostatic plate 12 may be locally controlled.

The wafer temperature control device 900 may be included in the configuration of the ESC 100 described in FIG. 1 and may be used to have a local temperature control of a wafer in a wafer etching process. However, the wafer temperature control device 900 is not limited thereto, and the wafer temperature control device 900 may be used in various fields requiring the local temperature control of the wafer. In an embodiment, the wafer temperature control device 900 may be included in a semiconductor performance testing apparatus that tests a performance of semiconductor chips on a wafer. The wafer temperature control device 900 may separately control a temperature of the plurality of semiconductor chips on the wafer during a semiconductor performance test.

FIG. 10 is a cross-sectional view of the inside of a wafer etching device 1000 including the ESC 100 according to an embodiment.

Referring to FIG. 10, the wafer etching device 1000 may include the ESC 100 mounted with the wafer 10, a process chamber 1001 including an interior space to etch the wafer 10, a gas injecting unit 1002 configured to inject a process gas to the inside of the process chamber 1001, and a plasma generating unit 1003 configured to provide plasma to the process gas supplied to the process chamber 1001.

The inside of a process chamber of a wafer etching device of the related art is made to be a high-temperature environment and high-temperature heat in the inside of the process chamber may be unevenly distributed, such that a temperature of a wafer fixed on the ESC inside the process chamber may be uneven. The uneven temperature of the wafer may make the performance of semiconductor chips uneven, and also a production of defective semiconductor chips may be increased. To solve this problem, the wafer etching device 1000 may include the ESC 100 of the inventive concept described above. An inventive concept of the ESC 100 may be substantially the same as described with reference to FIGS. 1 to 9, and thus detailed description will be omitted.

The plasma generating unit 1003 may be electrically connected to a radio-frequency power device 1010. The radio-frequency power device 1010 may output radio-frequency (RF) power, which is suitable to generate plasma, and transmit the RF power to the plasma generating unit 1003. The radio-frequency power device 1010 may be controlled by the controller 1050.

The gas supply device 1020 may inject process gas into the process chamber 1001 through the gas injecting unit 1002. The process gas injected into the process chamber 1001 by the gas supply device 1020 may be an etching gas and may also be a protective gas, which protects a pattern to be etched on the wafer 10.

The wafer etching device 1000 may further include a gate 1004 configured to provide a travel path of the wafer 10 to mount the wafer 10 on the ESC 100 in the process chamber 1001.

In addition, the wafer etching device 1000 may include a pump 1005. The pump 1005 may adjust an amount of air inside the process chamber 1001 to control a pressure inside the process chamber 1001.

The electrostatic plate 12 of the ESC 100 may be electrically connected to the ESC power device 1030. An electrostatic force is generated between the electrostatic plate 12 and the wafer 10 by power applied from the ESC power device 1030, for example, a direct current voltage, such that the wafer 10 firmly adheres on the ESC 100.

The plurality of heating elements 13 of the ESC 100 may be electrically connected to the heater power device 1040. The heater power device 1040 may control power according to a command of the controller 1050, and thus, the caloric values of the plurality of heating elements 13 may be adjusted.

A lower base (not shown) of the ESC 100 may be electrically connected to a bias power device 1060. Radio-frequency power may be applied from the bias power device 1060 to the lower base of the ESC 100 and the lower base of the ESC 100 may act as an electrode configured to generate plasma.

The cooling channel 14a of the cooling plate 14 of the ESC 100 may be connected to the temperature control device 1070 and the controller 1050. A flow rate and a temperature of cooling water circulating in the cooling channel 14a may be adjusted by the temperature control device 1070 and the controller 1050.

The wafer etching device 1000 including the ESC 100 of the inventive concept may generate plasma P, which is required in a wafer etching process. In particular, the process gas may be supplied from the gas supply device 1020 into the process chamber 1001 and the process gas may be diffused inside the process chamber 1001. A magnetic field is generated around the plasma generating unit 1003 by a current flowing to the plasma generating unit 1003, wherein the magnetic field may be supplied to the process chamber 1001. An induced electric field may be generated inside the process chamber 1001 by a temporal change of the magnetic field and electrons accelerated by the induced electric field may collide with molecules or atoms of the process gas to generate plasma P. A surface of the wafer 10 adhered on the ESC 100 may be etched by using the plasma P.

Figure 11:
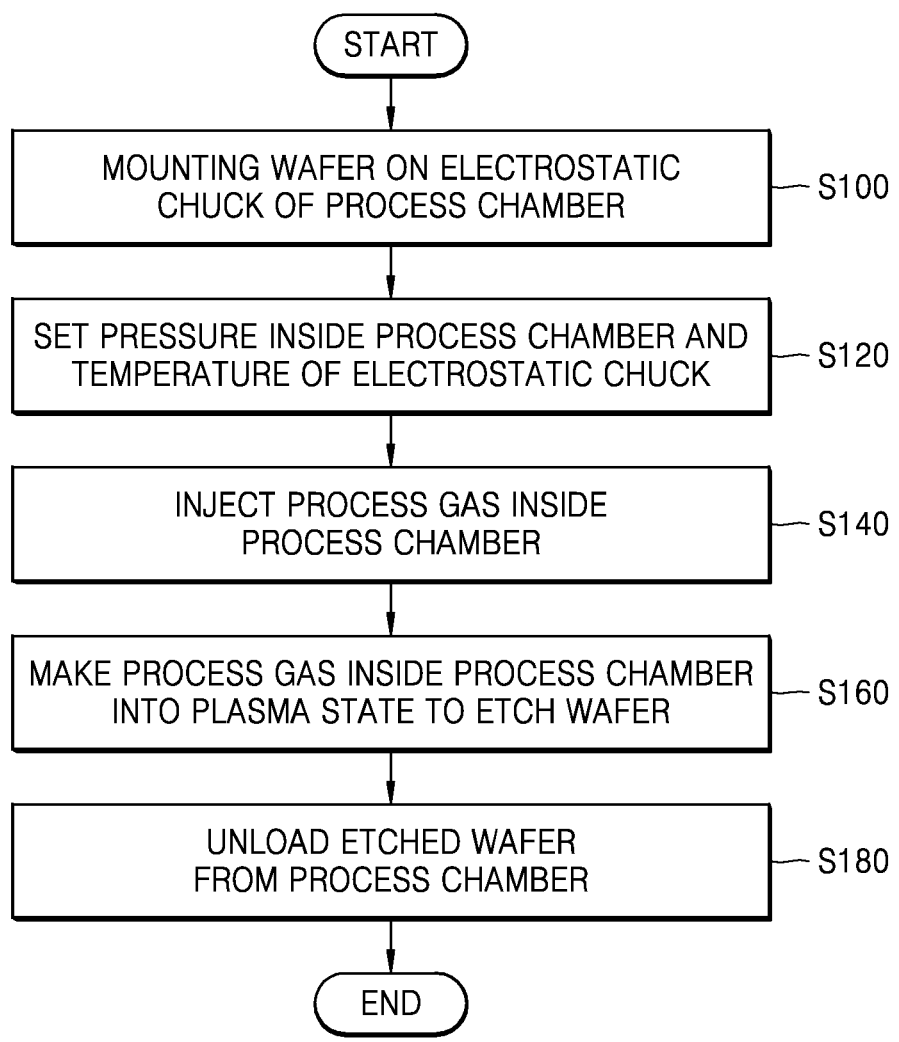
FIG. 11 is a flowchart illustrating a wafer etching method using a wafer etching device according to an embodiment.

FIG. 11 is a flowchart illustrating a wafer etching method of using a wafer etching device according to an embodiment.

The wafer etching method of using the wafer etching device 1000 of the inventive concept may include mounting the wafer 10, on which a material film such as an oxide film or a nitride film is formed, on the ESC 100 of the process chamber 1001 (S100).

When the wafer 10 is mounted on the ESC 100 of the inventive concept, setting a pressure inside the process chamber 1001 and a temperature of the ESC 100 may be performed (S120). The pressure of the process chamber 1001 and the temperature of the ESC 100 may be flexibly changed in a plasma treating process.

Then, injecting the process gas inside the process chamber 1001 may be performed (S140). The process gas, as described above, may be discharged from the gas supply device 1020 and supplied into the process chamber 1001 through the gas injecting unit 1002.

Then, making the process gas inside the process chamber 1001 into plasma state to etch the wafer 10 may be performed (S160). The process gas injected into the process chamber 1001, as described above, may become plasma state by the plasma generating unit 1003. A temperature of the wafer 10 may be locally controlled in the etching process (S160) due to a configuration of the ESC 100 including the electrostatic plate 12, the electrostatic plate 12 including the plurality of heating elements 13 and the heat blocking wall 12a of the inventive concept.

After the wafer 10 is etched, unloading the wafer 10, which is etched, from the process chamber 1001 may be performed (S180).

While the inventive concept has been particularly shown and described with reference to embodiments thereof, it will be understood that various changes in form and details may be made therein without departing from the spirit and scope of the following claims.

What is claimed is:

1. An electrostatic chuck comprising:
   a fixing plate on which a wafer is fixed;
   a disc shaped electrostatic plate, made of an electrically conductive material, located under the fixing plate and configured to generate an electrostatic force to fix the wafer on the fixing plate;
   a plurality of heating elements located under the electrostatic plate, wherein the plurality of heating elements are separated to locally control a temperature of the electrostatic plate; and
   a cooling plate located under the plurality of separated heating elements and configured to emit heat transferred by the plurality of separated heating elements,
   wherein the electrostatic plate comprises a plurality of heat blocking walls, which are embedded in the electrostatic plate, and configured to locally distribute, on the electrostatic plate, the heat transferred from the plurality of separated heating elements, and
   wherein the plurality of heat blocking walls include
      a first set of heat blocking walls arranged in a radial direction and formed in a concentrical shape surrounding the center of the electrostatic plate, the first set of heat blocking walls configured to suppress, in an azimuthal direction, a diffusion of heat transferred from the plurality of heating elements to the electrostatic plate, and
      a second set of heat blocking walls arranged as concentric walls extending in a continuous circular shape and spaced apart from the first set of heat blocking walls, the second set of heat blocking walls configured to suppress, in a radial direction, a diffusion of heat transferred from the plurality of heating elements to the electrostatic plate,
      wherein a first subset of the first set of the heat blocking walls are arranged within the perimeter of the second set of heat blocking walls and a second subset of the first set of the heat blocking walls are arranged outside the perimeter of the second set of heat blocking walls.

2. The electrostatic chuck of claim 1, wherein an upper surface of at least one of the plurality of separated heating elements has an area corresponding to an area of an individual semiconductor chip on the wafer.

3. The electrostatic chuck of claim 1, wherein an upper surface of at least one of the plurality of separated heating elements has an area corresponding to an area of about 2 to about 10 individual semiconductor chips on the wafer.

4. The electrostatic chuck of claim 1, wherein the plurality of separated heating elements are individually controlled.

5. The electrostatic chuck of claim 4, wherein the plurality of separated heating elements comprise at least one of a thermoelectric element, a resistance heater, and an inductance heater.

6. The electrostatic chuck of claim 1, wherein a material of the electrostatic plate comprises a metal matrix composite (MMC).

7. The electrostatic chuck of claim 6, wherein the first set of heat blocking walls of the electrostatic plate are formed as individual cavities inside the electrostatic plate.

8. The electrostatic chuck of claim 6, wherein
   a material of the second set of heat blocking walls has a thermal conductivity lower than a thermal conductivity of the material of the electrostatic plate.

9. The electrostatic chuck of claim 6, further comprising:
   an upper interfacial material layer between the electrostatic plate and the plurality of separated heating elements; and
   a lower interfacial material layer between the cooling plate and the plurality of separated heating elements.

10. The electrostatic chuck of claim 9, wherein a thermal conductivity of a material of the upper interfacial material layer is higher than a thermal conductivity of a material of the lower interfacial material layer.

11. A wafer etching device comprising:
   a process chamber comprising an interior space to etch a wafer;
   a gas supply device connected to the process chamber and configured to supply a process gas to etch the wafer, to the interior space of the process chamber; and
   an electrostatic chuck located inside the process chamber and configured to fix the wafer to be etched by the process gas,
   wherein the electrostatic chuck comprises:
   a fixing plate on which a wafer is fixed;
   a disc shaped electrostatic plate, made of an electrically conductive material, located under the fixing plate and configured to generate an electrostatic force to fix the wafer on the fixing plate;
   a plurality of heating elements located under the electrostatic plate and separated to locally control a temperature of the electrostatic plate; and
   a cooling plate located under the plurality of separated heating elements and configured to emit heat transferred by the plurality of separated heating elements,
   wherein the electrostatic plate comprises a plurality of heat blocking walls, which are embedded in the electrostatic plate, and configured to locally distribute, on the electrostatic plate, the heat transferred from the plurality of separated heating elements, and
   wherein the plurality of heat blocking walls include
      a first set of heat blocking walls arranged in a radial direction and formed in a concentrical shape surrounding the center of the electrostatic plate, the first set of heat blocking walls configured to suppress, in an azimuthal direction, a diffusion of heat transferred from the plurality of heating elements to the electrostatic plate, and a second set of heat blocking walls arranged as concentric walls extending in a continuous circular shape and spaced apart from the first set of heat blocking walls, the second set of heat blocking walls configured to suppress, in a radial direction, a diffusion of heat transferred from the plurality of heating elements to the electrostatic plate, wherein a first subset of the first set of the heat blocking walls are arranged within the perimeter of the second set of heat blocking walls and a second subset of the first set of the heat blocking walls are arranged outside the perimeter of the second set of heat blocking walls.

12. The wafer etching device of claim 11, wherein an upper surface of at least one of the plurality of separated heating elements has an area corresponding to an area of an individual semiconductor chip on the wafer or has an area corresponding to an area of 2 to 10 individual semiconductor chips on the wafer.

13. The wafer etching device of claim 12, wherein the plurality of separated heating elements are individually controlled.

14. The wafer etching device of claim 13, wherein the first set of heat blocking walls of the electrostatic plate are formed as individual cavities inside the electrostatic plate.

15. The wafer etching device of claim 13, wherein
a material of the second set of heat blocking walls has a thermal conductivity lower than a thermal conductivity of a material of the electrostatic plate.

16. A wafer temperature control device comprising:
a disc shaped electrostatic plate, made of an electrically conductive material, configured to generate an electrostatic force to fix a wafer, and
a plurality of heating elements separately located under the electrostatic plate and individually controlled to locally control a temperature of the electrostatic plate,
wherein the electrostatic plate comprises a plurality of heat blocking walls, which are embedded in the electrostatic plate, and configured to locally distribute on the electrostatic plate heat transferred from the plurality of separated heating elements, and wherein the plurality of heat blocking walls include
a first set of heat blocking walls arranged in a radial direction and formed in a concentrical shape surrounding the center of the electrostatic plate, the first set of heat blocking walls configured to suppress, in an azimuthal direction, a diffusion of heat transferred from the plurality of heating elements to the electrostatic plate, and
a second set of heat blocking walls arranged as concentric walls extending in a continuous circular shape and spaced apart from the first set of heat blocking walls, the second set of heat blocking walls configured to suppress, in a radial direction, a diffusion of heat transferred from the plurality of heating elements to the electrostatic plate,
wherein a first subset of the first set of the heat blocking walls are arranged within the perimeter of the second set of heat blocking walls and a second subset of the first set of the heat blocking walls are arranged outside the perimeter of the second set of heat blocking walls.

17. The wafer temperature control device of claim 16, wherein the first set of heat blocking walls of the electrostatic plate are formed as individual cavities inside the electrostatic plate to have a radial shape or an azimuthal shape.

18. The wafer temperature control device of claim 17, wherein an upper surface of at least one of the plurality of separated heating elements has an area corresponding to an area of an individual semiconductor chip on the wafer or has an area corresponding to an area of 2 to 10 individual semiconductor chips on the wafer.

* * * * *